United States Patent [19]
Davis, II et al.

[11] Patent Number: 5,424,921
[45] Date of Patent: Jun. 13, 1995

[54] ELECTRONIC ASSEMBLY INCORPORATING A THREE-DIMENSIONAL CIRCUIT BOARD

[75] Inventors: James T. Davis, II, Sunrise; Kok H. Chong, Tamarac; Thomas A. Goodwin, Coral Springs, all of Fla.

[73] Assignee: Motorola, Inc., Schaumburg, Ill.

[21] Appl. No.: 116,647

[22] Filed: Sep. 7, 1993

[51] Int. Cl.⁶ .............................................. H05C 9/00
[52] U.S. Cl. ..................................... 361/816; 361/792; 361/800; 361/814; 174/35 R; 174/35 TS; 257/659
[58] Field of Search ............... 361/736, 748, 792, 800, 361/785, 816, 814; 174/35 R, 35 TS; 257/659; 439/66

[56] References Cited

U.S. PATENT DOCUMENTS 3,345,568 10/1967 Errichiello et al. .
3,917,372 11/1975 Selinko .
5,187,642 2/1993 Garner et al. ....................... 361/386

Primary Examiner—Leo P. Picard
Assistant Examiner—Young Whang
Attorney, Agent, or Firm—Andrew S. Fuller

[57] ABSTRACT

An electronic assembly (100) includes a first circuit board (120) which houses electronic components (122), a second circuit board (140) being three-dimensional and having integral members (143) to receive and position the first circuit board (120), and an electrical connector (130) between the first circuit board (120) and the second circuit board (140).

17 Claims, 3 Drawing Sheets 5,424,921

ELECTRONIC ASSEMBLY INCORPORATING A THREE-DIMENSIONAL CIRCUIT BOARD

TECHNICAL FIELD

This invention relates in general to electronic devices, and in particular, to electronic devices utilizing multiple circuit boards.

BACKGROUND

Electronic devices are often manufactured into assemblies which comprise a main printed circuit board (PCB) mounted on a structural frame, and peripheral circuits to electrically couple the PCB to the external interfaces of the device, such as displays, and control buttons or knobs. The external interfaces will usually be included on a housing which encloses and protects the components of the device. A wireless communications electronic device, such as a radio, may also need a shield to protect the PCB from electrical interference. Thus, the typical assembly for a radio may include a frame, main PCB, shield, and peripheral external interface circuitry, as essential and often separate elements, which must be assembled and tested during manufacturing.

To perform a complete functional test of the radio, the essential elements of the radio must be first assembled into a functional unit, which includes external interfaces through which the functions of the radio are accessible. If the radio fails testing, disassembly for analysis and repair is usually required. Repeated assembly and disassembly during manufacturing increases the opportunities for introducing defects, and increases manufacturing costs.

Reducing costs and increasing efficiency are important goals of most manufacturing operations. Reducing the number of parts used for an assembly is usually considered an important step towards these goals. Additionally, early detection of potential defects through functional testing of subassemblies is important, as the cost of correcting defective products tends to be lower if the problem is detected early in the manufacturing process. Thus, an assembly which uses fewer parts, and which facilitates functional testing, is highly desirable in the art.

DETAILED DESCRIPTION OF THE PREFERRED EMBODIMENT

Figure 1:
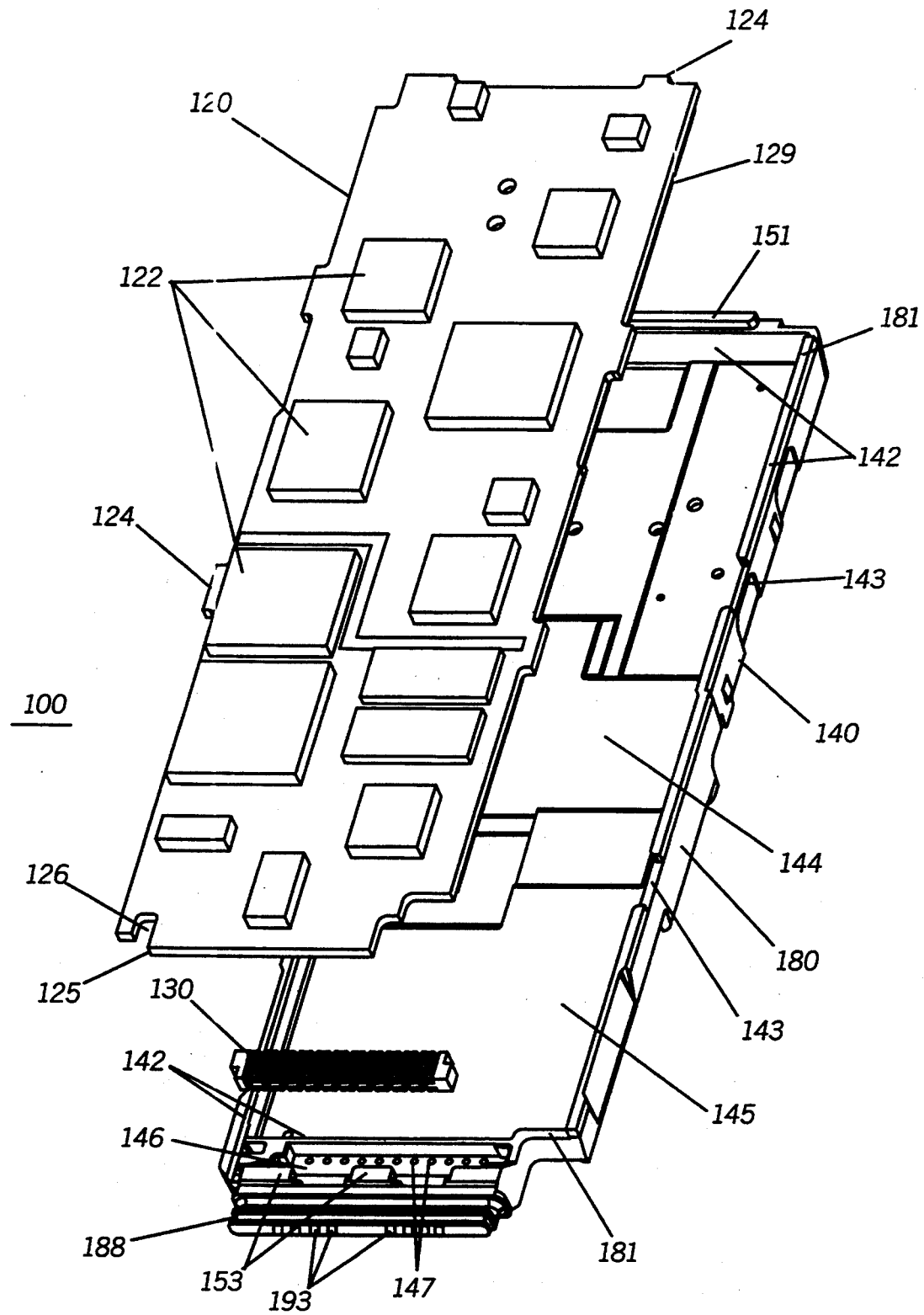
FIG. 1 is an exploded perspective view of an electronic assembly in accordance the present invention.

Referring to FIG. 1, an exploded view of an electronic assembly 100 is shown in accordance with present invention. The assembly 100 includes a printed circuit board ("circuit board") 120 mounted to a three-dimensional molded circuit board ("carrier board") 140 in a substantially parallel-piped structure, in which both boards 120, 140 are electrically interconnected by a compression connector 130 sandwiched there between. The carrier board 140 functions as a frame which provides structural support for the circuit board 120, and which provides structural support for the external electrical interfaces to the circuit board 120. The circuit board 120 combines with the carrier board 140 to form an easily transportable functional unit, in which the features implemented on the circuit board 120 can be tested in their normal mode of operation. Correspondingly, the assembly 100 can be quickly disassembled for analysis and repair.

Functionally, the circuit board 120 houses electronic components 122 linked in an electrical circuit which implements the specific features particular to an application, as is common in the art. In the preferred embodiment, the circuit board 120 houses radio circuitry, including communication circuitry for communicating information over a radio frequency channel. Structurally, the circuit board 120 is substantially rectangular, having a first surface 121 and an opposing second surface 129. Circuit components 120 are distributed across both surfaces of the board 120. Mounting extensions 124, 125, and slots 126, 127, peripherally located on the circuit board 120, position and secure the circuit board 120 on the carrier board 140. Additionally, an electrical interface pad (not shown) is located on the lower surface 129 to interface with the compression connector 130.

The carrier board 140 is formed from plastic, or similar material, using a three-dimensional printed circuit board plastic molding process. The carrier board 140 comprises a three-dimensional structure having a substantially rectangular base member 144 with four depending side walls 142. The side walls 142 extend from the base member 144 and terminate with an open face edge, thereby forming an open hollow compartment with an interior surface 145 and an exterior surface 180. The open face edge 181 of the side walls 142 form the mating interface for the circuit board 120. The side walls 142 are of sufficient height such that the base member 144 does not interfere with the circuit components 122 on the second surface 129 of the circuit board 120 when both boards 120, 140 are assembled. The interior surface 145 is coated with a metallic layer to provide electrical shielding for the circuit components 122 on the lower surface 129 of the circuit board 120.

Along the open face edge of the side walls 142 are slots 143 which form integral positioning members to receive and position the circuit board 120. The positioning members 143 combine with the mounting extensions 124 on the circuit board 120 to form tongue and groove arrangements which help to secure the circuit board 120 to the carrier board 140. This configuration also helps to limit lateral movement between both boards 120, 140. Retaining lips 153 formed on one side wall and a stop 15 1 formed on the opposing side wall of the carrier board 140, interact with a mounting extension 125 and a recessed area 127 of the circuit board 120, to anchor the circuit board 120 to the carrier board 140.

A pocket 146 is formed within the carrier board 140 for seating the compression connector 130. The compression connector 130 interfaces with an electrical interconnect interface 147 located within the pocket 146. During assembly, the compression connector 130 is positioned within the pocket 146, and the circuit board 120 is aligned with the carrier board 140 such that the compression connector 130 electrically engages the electrical interface of both boards 120, 140. The electrical interconnect interface 147 also provides electrical connection to the exterior surface 180 of the carrier board 140.

Figure 2:
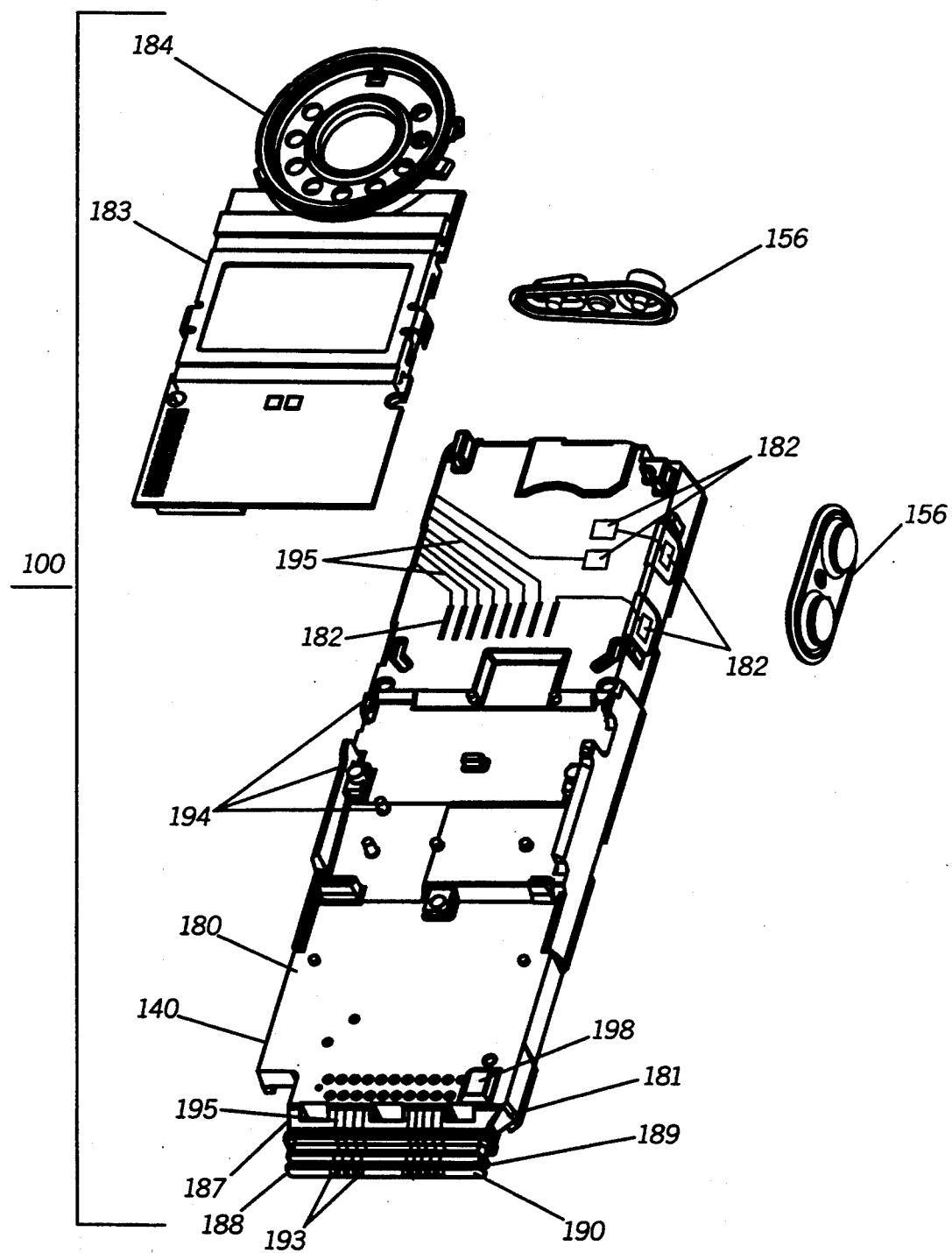
FIG. 2 is a perspective view of the exterior surface of a molded circuit board including attachments, in accordance with the present invention.

FIG. 2 is an exploded view of the exterior of the carrier board 140 showing mounted attachments 183, 184, 156. The exterior surface 180 houses electrical interfaces, and mechanical connections 194 for the attachments to the carrier board 140. Electrical runners 195 form a three-dimensional conductive pattern which traverses the carrier board 140 and electrically connect various portions thereof. An accessory connector 188 is integrally formed on the exterior surface 180 to provide an electrical interface connection for external devices. The accessory connector 188 is formed from a protrusion 187 one end 181 of the carrier board 140, which includes a groove 189 encircling the protrusion 187. The groove 189 accommodates a seal (not shown) to facilitate installation within a device housing. The electrical interface connection on the accessory connector 188 comprises electrical contact pads 193 along the face 190 of the protrusion 187. Additional contact pads 182 are located on the exterior surface 180 to support attachments, such as user interfaces and the like. The contact pads 182, 193, which are electrically coupled to electrical runners 195, are conductive surfaces without insulation. The contact pads 182, 183 may be formed by selectively gold plating portions of the electrical runners 195 located on the exterior surface 180. The attachments provide user level functionality to the assembly 100, and include a speaker 184, control buttons 156, a display device 183, and may also include other external accessories. These attachments 183, 184, 156 are mechanically coupled to the exterior surface 180 of the carrier board 140 with integral mount connections 194, or other mechanisms, and are electrically coupled to the carrier board 140 through the contact pads 182. A hall-effect switch 198 is also shown which serves as a power switch for the assembly 100.

Figure 3:
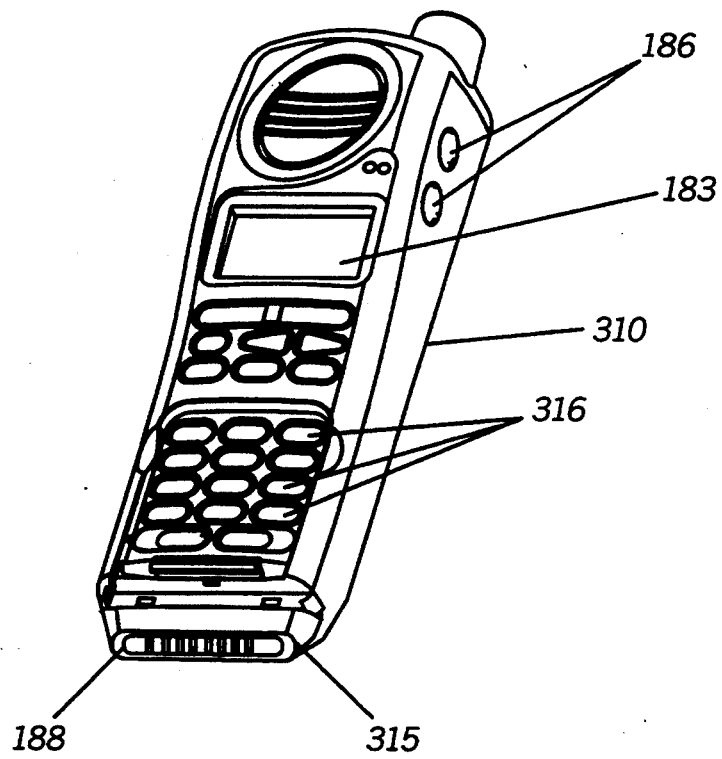
FIG. 3 is a perspective view of a radio with an exposed accessory connector, in accordance with the present invention.

Referring to FIG. 3, a radio 300 is shown representing an electronic device in accordance with the present invention. The radio includes a radio housing 310, a radio key pad 316, the display 183, the control buttons 156, and other features typically found in a radio. The radio 300 also includes the electronic assembly 100 (see FIG. 1) which houses radio circuitry including communication circuitry for communicating information over a radio frequency channel. The electronic assembly 100 mounts within the radio housing 310 such that the accessory connector 188 extends through an opening 315 in the housing 310, thereby exposing the accessory connector 188. The accessory connector 188 provides an external electrical interface to the internal radio operations.

Referring back to FIG. 1, several benefits are derived from the configuration described above. The electronic assembly 100 forms a functional unit in which the external interfaces on the carrier board 140 provide electrical access to the features implemented on the circuit board 120. Accordingly, the functional features of an electronic device incorporating the present invention can be evaluated before the final packaging of the device. Functional testing may begin early in the manufacturing process as soon as the functional unit is complete. It is well known in the art that early testing results in an earlier detection of potential defects, and therefore a lower cost of addressing these defects. The electronic assembly 100 is an easily portable unit, which can be quickly assembled and disassembled for analysis and repair. In the preferred embodiment, external interfaces, such as the accessory connector 188, are integrally formed on the cartier board 140, therefore reducing the number of parts required to complete the assembly 100. Thus, an electronic assembly made in accordance with the present invention can contribute in reducing manufacturing costs and increasing manufacturing efficiency.

What is claimed is:

1. An electronic assembly, comprising:
   a first circuit board having a plurality of electronic components;
   a second circuit board being three-dimensional having a three-dimensional circuit pattern thereon and having locating means for receiving and positioning said first circuit board: and
   interconnect means for electrically interconnecting said first and second circuit boards;
   wherein said second circuit board has a base member with depending peripheral side walls forming an open compartment.

2. An electronic assembly as defined in claim 1, wherein said locating means are positioned on said side walls, and said first and second circuit boards are assembled to provide a substantially parallel-piped structure.

3. An electronic assembly as defined in claim 1, wherein external electrical interfacing to said first circuit board is provided through said second circuit board.

4. An electronic assembly as defined in claim 1, wherein said interconnect means comprises an electrical connector mounted between said first and second circuit boards.

5. An electronic assembly as defined in claim 1, wherein said second circuit board includes a shield portion for shielding a portion of said first circuit board.

6. An electronic assembly, comprising:
   a first circuit board having a plurality of electronic components;
   a second circuit board being three-dimensional having a three-dimensional circuit pattern thereon and having locating means for receiving and positioning said first circuit board; and
   interconnect means for electrically interconnecting said first and second circuit boards;
   wherein said second circuit board includes an integral accessory connector for interfacing with external accessories.

7. An electronic assembly as defined in claim 1, wherein said second circuit board has an interior surface having metallic coating thereon.

8. A radio, comprising:
   a first radio circuit board having electronic circuitry;
   a second circuit board being three-dimensional having a three-dimensional circuit pattern and having a member with four depending peripheral side walls said second circuit board having locating means for receiving and positioning said first circuit board said first and second circuit are assembled to provide a substantially parallel-piped structure, said second circuit board providing external electrical interfacing to said first circuit board, said second circuit board including a shield portion for shielding said first circuit board;
   an electrical connector electrically interconnecting said first and second radio circuit boards: and
   a radio housing having an opening, said first and second circuit boards being located within said housing;

said second circuit board including an integrally formed connector portion, which is accessible through said housing opening.

9. An electronic assembly, comprising:
a first circuit board having a plurality of electronic components; and
a second circuit board having a base and integrally formed walls extending to define a three-dimensional compartment that receives at least a portion of the first circuit board, the second circuit board having a three-dimensional circuit pattern including electrical runners that traverse the base and the integrally formed walls defining the three-dimensional compartment, the second circuit board being electrically interconnected with the first circuit board.

10. The electronic assembly of claim 9, wherein the sidewalls of the second circuit board include integral positioning and retaining members that anchor the first circuit board such that the second circuit board forms a carrier frame for the first circuit board.

11. The electronic assembly of claim 10, wherein the second circuit board includes positioning and retaining members integrally formed thereon for positioning and retaining the first circuit board.

12. The electronic assembly of claim 10, further comprising electrical contact pads located on an exterior surface of said second circuit board and providing external electrical interfacing to said first circuit board through said second circuit board.

13. The electronic assembly of claim 10, further comprising an electrical connector mounted between said first and second circuit boards and engaging both the first and second circuit boards.

14. The electronic assembly of claim 10, wherein said first and second circuit boards form a portion of a radio circuit.

15. The electronic assembly of claim 10, wherein said second circuit board includes a shield portion for shielding a portion of said first circuit board.

16. The electronic assembly of claim 9, wherein said second circuit board includes an integral accessory connector for interfacing with external accessories.

17. The electronic assembly of claim 9, wherein said second circuit board has a base member with depending peripheral side walls which form the compartment.

* * * * *